United States Patent [19]

Chang

[11] 4,042,448
[45] Aug. 16, 1977

[54] POST TGZM SURFACE ETCH

[75] Inventor: Mike F. Chang, Liverpool, N.Y.

[73] Assignee: General Electric Company, Syracuse, N.Y.

[21] Appl. No.: 635,327

[22] Filed: Nov. 26, 1975

[51] Int. Cl.² .......................................... H01L 21/306
[52] U.S. Cl. .................... 156/650; 148/187; 148/188; 156/657; 156/661; 156/662; 357/50
[58] Field of Search .......... 156/3, 8, 11, 17, 648–651, 156/654–658, 661, 662; 29/580, 583; 148/1.5, 179, 187, 188; 357/47–51; 427/93, 95

[56] References Cited

U.S. PATENT DOCUMENTS

| 3,272,748 | 9/1966 | Szkudlapski | 252/79.3 |
| 3,379,584 | 4/1968 | Bean et al. | 148/1.5 X |
| 3,608,186 | 9/1971 | Hutson | 29/583 |
| 3,706,129 | 12/1972 | McCann | 29/583 |
| 3,901,736 | 8/1975 | Anthony et al. | 148/187 X |
| 3,920,482 | 11/1975 | Russell | 156/3 X |

Primary Examiner—William A. Powell
Attorney, Agent, or Firm—R. J. Mooney; D. E. Stoner

[57] ABSTRACT

Disclosed is a technique useful in the manufacture of semiconductor devices. A semiconductor wafer is provided and isolation regions are formed therein by the temperature gradient zone melting process. A mask is applied to the surface of the wafer, but the portions of the surface near the isolation regions are left exposed. An etching step follows which removes a small amount of material from the surface of the isolation regions to smooth irregularities formed there during the zone melting process.

18 Claims, 14 Drawing Figures

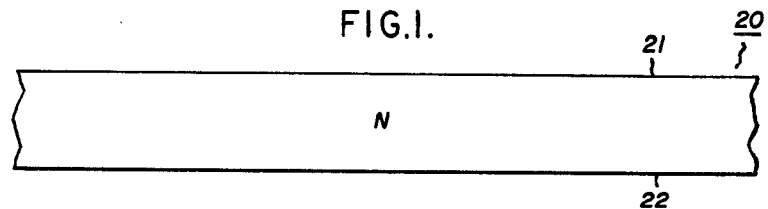
FIG.I.
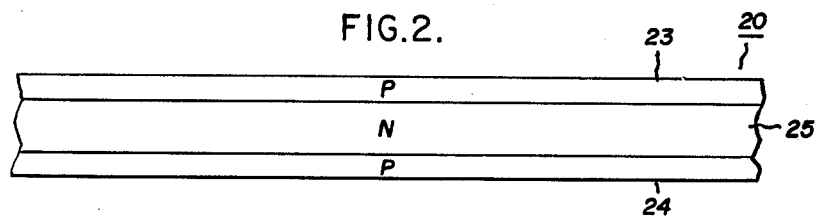
FIG.2.
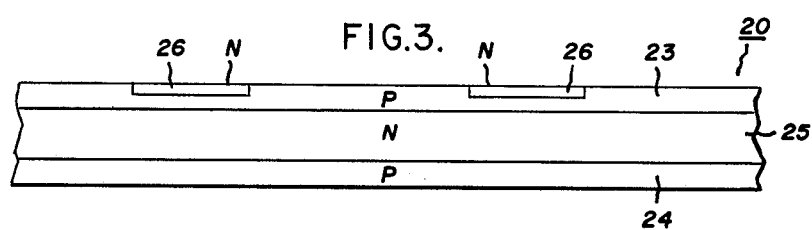
FIG.3.
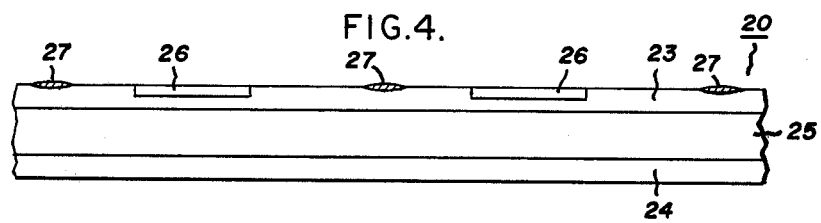
FIG.4.
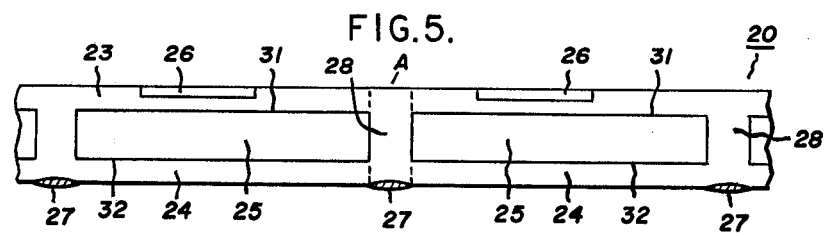
FIG.5.
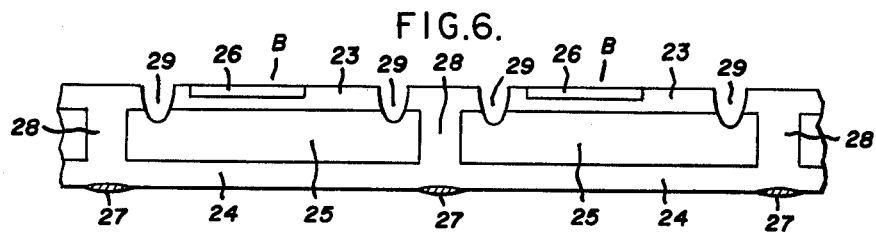
FIG.6.
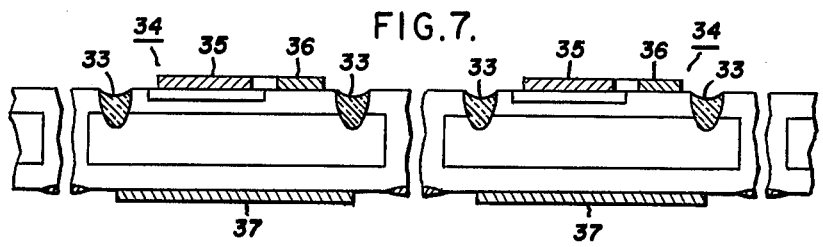
FIG.7.

POST TGZM SURFACE ETCH

BACKGROUND OF THE INVENTION

This invention relates to the manufacture of semiconductor devices and more particularly to a process incorporating temperature gradient zone melting techniques.

Temperature gradient zone melting is a process in which a small amount of a migrating material is placed on the surface of a larger body of a carrier material and the combination is raised to an elevated temperature. A temperature gradient is imposed across the body of carrier material with the migrating material at the cool end. A melt containing both of the materials is formed and migrates toward the hotter portion of the carrier material. In the path of the melt is left a recrystallized region of the carrier material containing a concentration of the migrating material in an amount equal to the solid solubility limit at the temperature of migration. This process has been found useful in the manufacture of semiconductors. When used in semiconductor manufacture, the carrier material is typically a body or wafer of semiconductor material such as silicon, germanium or a compound semiconductor material such as gallium arsenide. The migrating material is generally a conductivity modifying impurity such as aluminum, but it can serve other purposes, such as altering carrier lifetime if gold or platinum is migrated.

When practicing temperature gradient zone melting in the manufacture of semiconductor devices, it was occasionally found that processes requiring post TGZM masking and etching operations provided an unexpectedly low yield. It was discovered that this was due to a difficulty in effectively masking the wafer caused by irregularities in the surface formed during the temperature gradient zone melting process.

It is an object of this invention, therefore, to provide a technique which overcomes the aforementioned disadvantages when temperature gradient zone melting is used in the manufacture of semiconductors.

SUMMARY OF THE INVENTION

This invention is characterized by the following steps which can be utilized when manufacturing semiconductor devices by the temperature gradient zone melting technique. First, a quantity of an impurity is thermally migrated through a semiconductor material from a first surface to a second surface at an elevated temperature. This provides a region in the body containing the impurity in a uniform distribution and in an amount equal to the solid solubility limit of the impurity in the semiconductor material at the elevated temperature. Following migration, part of the first surface of the body is covered with a mask, but the portion where the impurity entered and the immediately surrounding portion is left exposed. Next, the first surface is exposed to an etchant to remove a small amount of material from the nonmasked portions thereof to substantially smooth the first surface at the exposed portion. Thus, any surface irregularities that were generated during the temperature gradient zone melting process are substantially removed.

DESCRIPTION OF THE DRAWINGS

These and other features and objects of the present invention will become more apparent upon a perusal of the following description taken in conjunction with the accompanying drawings wherein:

FIG. 1 is a sectonal elevation view of a semiconductor wafer;

FIG. 2 is a sectional elevation view of the wafer of FIG. 1 following initial diffusion in accordance with the subject invention;

FIG. 3 is an elevation view of the wafer of FIGS. 1 and 2 following yet another diffusion step;

FIG. 4 is an elevation view of the wafer of FIG. 3 as it is prepared for the thermomigration;

FIG. 5 is an elevation view of the wafer of FIG. 4 following thermomigration;

FIG. 6 is an elevation view of the wafer following the formation of the peripheral grooves;

FIG. 7 illustrates finished SCR device pellets;

DESCRIPTION OF THE PREFERRED

Method

Figure 8:
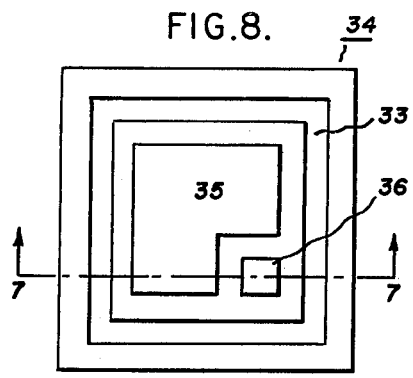
FIG. 8 is a plan view of a completed SCR pellet.

Referring first to FIG. 1, there is shown a body of semiconductor material in the form of a wafer 20 which defines a first major surface 21 and a second major surface 22. The wafer may be any convenient size such as is normally used in the semiconductor processing art. For example, it may be approximately 16 mils in thickness and 2 inches in diameter. Only a portion of the wafer 20 is shown in order to preserve clarity in the Figures.

The wafer 20 contains a first type of impurity that imparts to the wafer one conductivity type. For purposes of illustration, it will subsequently be assumed that the wafer 20 consists of silicon and that the one conductivity type is N-type. Thus, the first type of impurity is an impurity that imparts N-type conductivity, such as arsenic or phosphorus.

Referring now to FIG. 2, there is shown an elevation view of the wafer 20 following a subsequent processing step. A second type of impurity which imparts to the wafer the opposite, or P, conductivity type is diffused in from each major surface. The second type of impurity can be, for example, gallium or boron. Thus, the wafer 20 has three stacked layers or regions, two outer P-type regions 23 and 24, and an interior N-type region 25. In the example being pursued, that is utilizing a 16 mil thick wafer, the regions 23 and 24 are each preferably about 3 mils in thickness. A 3-mil depth will be reached following a diffusion time of about 45 hours at 1250° C. Such diffusion cycles are well known in the prior art.

Referring now to FIG. 3, there is shown the wafer of FIG. 2 with spaced cathode emitter regions 26 diffused part way through the region 23. The cathode emitter regions are N-type and can be formed by the diffusion of a first type of impurity at 1250° C for approximately 7 to 10 hours. Again, such diffusion cycles are well known in the prior art as are the preceding photoresist masking steps. The cathode emitter regions could also be formed by other conventional techniques, such as alloying.

Referring now to FIG. 4, there is shown the wafer 20 of FIG. 3 prepared for the temperature gradient zone melting, or thermomigration, step. Elongated bodies 27 of a second type of conductivity modifying impurity, such as aluminum, are disposed on the major surface 21. The elongated bodies run perpendicularly to the paper and thus their size is not fully appreciated solely from FIG. 4. The elongated bodies are shown partially intruding into the region 23 because the aluminum 27 must be in intimate contact with the silicon. Thus, it is helpful to slightly groove the surface of the silicon where the aluminum is to be placed. Alternatively, the aluminum can be alloyed or thermocompression bonded in place. Such methods of intimately associating the aluminum and the silicon are known in the prior art. See, for example, U.S. Pat. Nos. 3,895,967 issued to T. R. Anthony, et al.; 3,901,736 issued to T. R. Anthony, et al.; and 3,897,277 issued to S. M. Blumenfeld; all assigned to the present assignee. Or, the impurity can be located by an oxide mask. See the patent application entitled, "Thermal Migration With Oxide Channel," filed Nov. 21, 1975 in the name of Chang, et al. and assigned Ser. No. 634,247.

Referring now to FIG. 5, there is shown the wafer 20 of FIG. 4 following the thermomigration step. The elongated bodies of material 27 have migrated through the wafer from the major surface 21 to the major surface 22 leaving in their path isolation regions 28 of the opposite, P, conductivity type. The isolation regions are regions of silicon uniformly doped to the solid solubility limit of aluminum in silicon at the elevated temperature of migration. The heavily doped isolation regions really extend completely from one major surface to the other as shown by the combination of solid and broken lines at A for the center region. However, the boundary of the isolation region indicated by the broken line has been omitted from the other regions in FIG. 5 and from subsequent drawings inasmuch as the regions 23 and 24 are P-type regions and thus no P/N junction exists between them and the regions 28.

Essentially, the temperature gradient zone melting process is carried on by exposing the wafer 20 to a temperature gradient while the entire wafer is maintained at an elevated temperature. Typically, if the temperature of the wafer is in excess of about 800° or 900° C, a temperature gradient of a few degrees to a few hundred degrees will cause the aluminum to migrate through the wafer, from cold to hot, leaving in its trail a recrystallized region doped to the solid solubility limit of aluminum in silicon at the migration temperature. Excellent migration is obtained at about 1200° C with a temperature gradient of about 5° across the wafer. This requires 5 to 10 minutes.

For further background information relating to the temperature gradient zone melting process, reference is made to U.S. Pat. No. 3,899,362 issued to H. E. Cline, et al., and the U.S. patent application, Ser. No. 578,807, filed May 19, 1975, in the name of John K. Boah, and entitled, "Temperature Gradient Zone Melting Utilizing Infrared Radiation," both assigned to the present assignee.

FIG. 5 shows two device regions separated by the central isolation region 28 at A. Each device region consists of an interior region 25 of N-type conductivity completely surrounded by semiconductor material of P-type conductivity. It will be appreciated by those skilled in the art that the entire wafer 20 will usually contain many separate device regions. Furthermore, it will be appreciated by those skilled in the semiconductor art that the isolation regions 28 are formed in a grid pattern and really extend around the entire periphery of the device region. This is shown clearly in the subsequent plan views.

Referring now to FIG. 6, there is shown an elevation view of the wafer 20 with peripheral grooves 29 formed in the outer region 23 and extending into the interior region 25. The grooves 29 are formed by conventional photolithographic masking and etching techniques and extend along each of the isolation regions as illustrated in FIG. 8. An examination of FIG. 6 reveals that the portions B of the region 23 within the peripheral groove 29 are electrically isolated from the region 24 due to the back-to-back P/N junctions 31 and 32. Thus, when the grooves are filled with a passivating material 33 as shown best in FIG. 7, the two semiconductor junctions 31 and 32 are completely passivated with a single groove and application of passivant material 33. The passivant material 33 can be glass applied in a known manner. However, it should be appreciated that other passivating material can be used. For example, oxide or one of the new organic passivant materials can be advantageously employed.

When wafer 20 is subdivided through the isolation regions 28 as shown in FIG. 7, individual semiconductor device pellets 34 are formed. Those skilled in the art will recognize the pellets 34 as SCR pellets. Finally, metal contacts 35, 36, and 37 are added in a conventional manner. A plan view of a pellet 34 is shown in FIG. 8.

Figure 9:
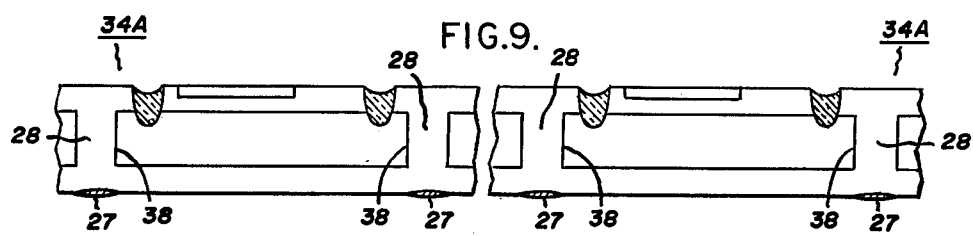
FIG. 9 is a sectional elevation view of two SCR pellets illustrating a modification of the pellets of FIG. 7.

A modification of the semiconductor device pellet 34 is shown in FIG. 9 and and is denoted 34A. The difference between the devices 34 and 34A is that during the formation of the pellets 34A, an array of pairs of closely spaced, parallel, elongated bodies 27 of dopant material are deposited on the wafer. Thus, following thermomigration, there are two closely spaced isolation regions 38 in the area that will be broken during subdivision. This can be thought of as a composite isolation region. Thus, subdivision takes place between the two closely spaced isolation regions 28. The embodiment 34A is advantageous inasmuch as the scribing and breaking operations do not have to be as precisely carried out since the break line is substantially spaced from the P/N junction 38. However, the embodiment 34A may be less economical than the embodiment 34 inasmuch as a greater wafer area is required for the two isolation regions. Thus, a certain amount of silicon is lost. It must be understood that a two-dimensional pattern of closely spaced, parallel bodies 27 is used so that the device regions are completely isolated.

More information concerning this type of semiconductor geometry and modifications thereof can be found in the concurrently filed application of Boah, et al., entitled, "Semiconductor Device and Method of Manufacture Thereof" and assigned Ser. No. 635,747.

Figure 10:
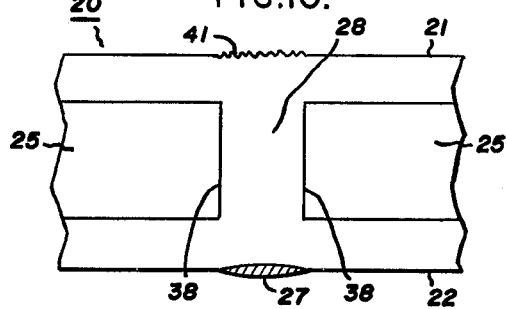
FIG. 10 is a sectional detail view of the portion of the wafer of FIG. 5 near an isolation region.
Figure 11:
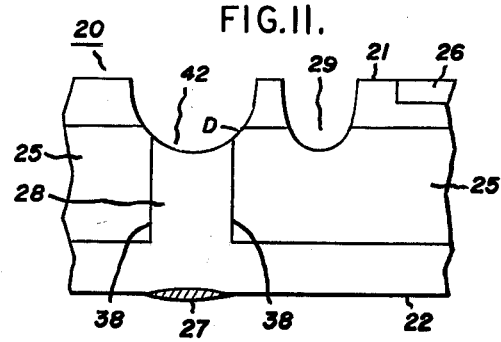
FIG. 11 is similar to FIG. 9 but shows an unwanted groove formed in the isolation region which is avoided by following the technique herein.

Referring now to FIG. 10, there is shown a sectional detailed view of an isolation region 28. The portion 41 of the first surface 21 where the impurity 27 entered is seen to be relatively rough. (The actual degree of roughness is exaggerated in the Figure for clarity.) This roughness is found following the temperature gradient zone melting process. If the roughness is excessive, it is sometimes difficult to properly mask the region 41 for subsequent processing steps. For example, if masking difficulty is encountered during the masking and etching steps used to form the peripheral grooves 29, an unwanted groove 42 may be formed in the isolation region 28 if the groove etching mask fails. This condition is illustrated in FIG. 11. It will be appreciated that if the groove 42 is large and deep enough, the P/N junction 38 will be broken at the point D. Thus, the junction may be exposed, unpassivated, in the groove 38. In that event, premature device failure can occur. It has been found that device yields can be improved by practice of the following steps which prevent the formation of the unwanted groove 42. These steps are carried out after diffusion and migration, but prior to groove etching.

Figure 12:
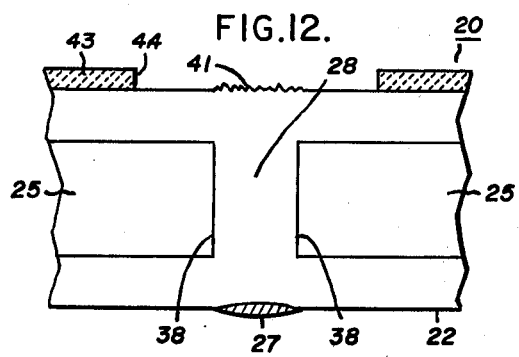
FIG. 12 is a detail view illustrating an etch mask used in accordance with the subject invention.

Referring now to FIG. 12, there is shown the portion of the wafer which was depicted in FIG. 10. Part of the first surface 21 is covered with a mask 43. The portion 41 where the impurity 27 entered is left exposed as is a small area immediately therearound. Preferably, in the manufacture of the device described above, the mask 43 covers substantially all of the first surface except for the portions 41 and the areas therearound. However, for other semiconductor devices, it may not be necessary to cover the entire first surface.

The type of mask employed can be selected upon consideration of such factors as the etchant to be used and the type of semiconductor material constituting the wafer 20. For example, a photoresist can be deposited and later patterned, or a wax mask can be screened in place. Alternately, a layer of oxide can be grown on the surface 21 and patterned by photolithographic techniques.

The first surface 21 is next exposed to an etchant to remove a small amount of material from the non-masked portions. This material removal substantially eliminates the irregularities in the portion 41. In a semiconductor device with dimensions such as those described above, it is preferable to control the process so that only about 1 mil of material is removed from the non-masked portion. However, as devices of other dimensions are fabricated, it may be desirable to remove more or less material. It has been found that exposure to Dimetch (acetic acid, hydrofluoric acid, nitric acid, and iodine) for approximately 120 seconds effectively removes approximately one mil in the non-masked portions of the surface 21. Following the etching operation, the wafer is in the form indicated by FIG. 13.

Figure 13:
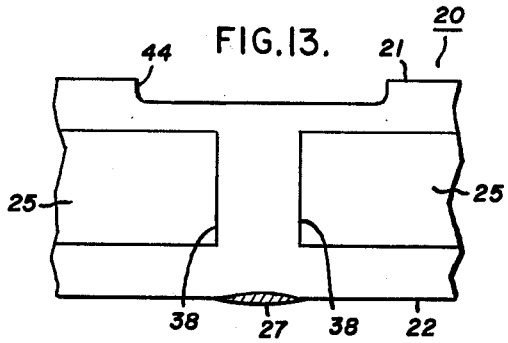
FIG. 13 is a detail view of the wafer following the novel etch disclosed herein.

A boundary 44 of the non-masked portion is defined by the mask 43 as indicated in FIG. 12. The boundary 44 is slightly separated from where the impurity entered. A small step will occur at this boundary 44 following the etching operation as indicated in FIG. 13. Some difficulty may be encountered in masking this boundary during subsequent steps if such masking is necessary. The degree of difficulty will, of course, depend upon such factors as the amount of material removed from the non-masked portions. However, it is felt that it is easier to control subsequent processing of the device with only one discontinuity at a known location than with the unpredictable irregularity that was exhibited in the region 41. It is possible, in fact, in the device described above to eliminate any effect of the discontinuity at the boundary 44 in a manner to be subsequently described.

Figure 14:
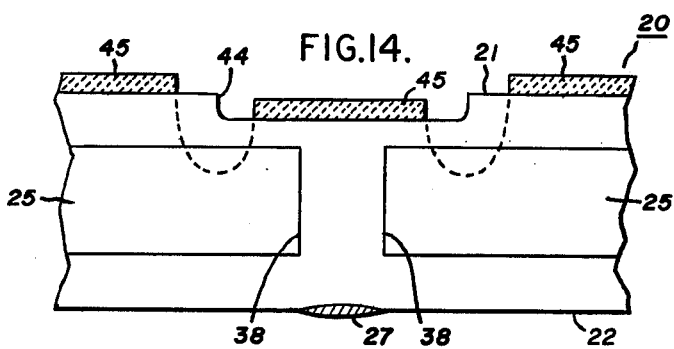
FIG. 14 is a detail view of a groove etch mask used in accordance with the teaching herein.

Referring to FIG. 14, a second mask 45 for the groove-etch is placed on the surface 21. It is seen that the exposed portion or the surface 21 where the grooves are to be formed includes the boundary 44. Thus, no effort need be made to mask the dicontinuities at the boundaries 44. The surface 21 is again exposed to an etchant in a conventional manner to form the grooves (indicated by dotted lines in FIG. 14) and the discontinuity created at the boundary 44 is removed during the groove etching process.

It will be appreciated that this process can be modified as needed for particular semiconductor geometries. For example, when the device depicted in FIG. 9 is manufactured, precisely the same techniques are employed except that the non-masked region depicted in FIG. 12 is somewhat wider inasmuch as there are two regions 41 where the two isolation regions 28 of the composite isolation region are formed.

Thus, it will be appreciated that a method has been disclosed which permits smoothing of the roughened region 41 where semiconductor device yields can be improved by such smoothing. An advantage of the present technique which will be appreciated from the above description is that most of the surface 21 is covered by the mask 43 and is unaffected by the smoothing etching operation. Thus, dopant surface concentrations and the like on the majority of the surface 21 are not affected and subsequent steps such as electroding processes are simplified.

In order to make a further improvement in the process of manufacturing the subject device, it has been found helpful to perform a short diffusion cycle following the thermal migration step. The cycle is preferably carried out at about 1200° C for 4 to 16 hours. During the diffusion cycle, most breaks in the isolation regions 28 will be closed and, thus, device yields will be further improved. The post diffusion cycle and its advantages are more fully described in a patent application filed concurrently herewith by Anthony, et al., and entitled, "Post Diffusion After Temperature Gradient Zone Melting" and assigned Ser. No. 635,368.

In view of the foregoing, many modifications and variations of the subject invention will be apparent to those skilled in the art. It is to be understood therefore that the scope of this invention is limited only by the following claims.

What is claimed is:

1. In the process of manufacturing a semiconductor device, the steps of:
    thermally migrating a quantity of an impurity through a body of semiconductor material from a first surface to a second surface at an elevated temperature so as to provide in said body a region containing said impurity in a uniform distribution in an amount equal to the solid solubility limit of said impurity in said semiconductor material at said elevated temperature;
    masking a part of said first surface, leaving exposed the portion of said first surface where said impurity entered; and
    exposing said first surface to an etchant to remove about 1 mil of material from the non-masked portions thereof to substantially smooth said first surface at said non-masked portions.

2. The steps of claim 1 wherein said masking step comprises masking substantially all of said first surface except the portions where said impurity entered said surface and the region immediately therearound.

3. The steps of claim 1 wherein said impurity is a conductivity modifying impurity.

4. The steps of claim 1 wherein said step of masking comprises applying photoresist to said surface and patterning said photoresist.

5. The steps of claim 1 wherein said step of masking comprises applying a wax mask.

6. The steps of claim 1 wherein said first surface is covered with oxide and said step of masking comprises patterning said oxide by photolithography.

7. The steps of claim 6, wherein said etchant comprises acetic acid, hydrofluoric acid, nitric acid and iodine, and said first surface is exposed to said etchant for about 120 seconds.

8. In the process of manufacturing a semiconductor device, the steps of:
 thermally migrating a quantity of an impurity through a body of semiconductor material from a first surface to a second surface at an elevated temperature so as to provide in said body a region containing said impurity in a uniform distribution in an amount equal to the solid solubility limit of said impurity in said semiconductor material at said elevated temperature;
 masking part of said first surface, leaving exposed the portions of said first surface where said impurity entered, said masking step comprising forming a mask delineating the boundary of said portion;
 exposing said first surface to an etchant to remove a small amount of material from the non-masked portions thereof to substantially smooth said first surface at said non-masked portions;
 applying a second mask covering at least a portion of said non-masked portions and part of the previously masked portions, but leaving said boundary exposed; and
 again exposing said first surface to an etchant to remove material from said body at and around said boundary.

9. The steps of claim 8 wherein the first masking step comprises masking substantially all of said first surface except the portions where said impurity entered said surface and the region immediately therearound.

10. The steps of claim 8 wherein the first step of exposing said first surface to an etchant is controlled so that only about 1 mil of material is removed from said non-masked portions.

11. The steps of claim 8 wherein said impurity is a conductivity modifying impurity.

12. A method of making semiconductor devices comprising the steps of:
 providing a wafer of semiconductor material, said wafer containing a first type of impurity for imparting one conductivity type thereto;
 thermomigrating through said wafer, from one major surface, a plurality of elongated bodies of a material which is an impurity of a second type which imparts the opposite conductivity type to said semiconductor material, said thermomigrating step forming a plurality of isolation regions that separate a plurality of device regions of said given conductivity type in said wafer;
 diffusing an impurity of the second type into each major surface of said wafer so that of said device regions comprises an interior region of said one conductivity type surrounded by semiconductor material of said opposite type;
 applying a mask to all of said one major surface except the regions around said isolation regions, said mask defining a boundary of the non-masked area, said boundary being separated from where said bodies entered;
 exposing said one major surface to an etchant to remove a small amount of material from the non-masked portions thereof to substantially smooth said first surface at said non-masked portions;
 forming a peripheral groove in each of said device regions in said one major surface, said groove extending into the associated interior region such that the area of said one major surface within said groove is electrically isolated from the other major surface and such that said boundary is removed when said groove is formed;
 passivating said groove; and
 subdividing said wafer into semiconductor device pellets, each containing one of said device regions.

13. A method according to claim 12 comprising the additional step of forming a cathode emitter of said given conductivity type adjacent part of said one major surface of said device regions, said additional step being carried out prior to said step of forming grooves.

14. A method according to claim 12 wherein the subdivision is through said isolation regions.

15. A method according to claim 12 wherein each of said isolation regions is formed by migrating two closely spaced elongated bodies such that each isolation region is a composite isolation region comprising two regions of said opposite conductivity type separated by a thin region of said one conductivity type and the subdivision is through said thin region.

16. A method according to claim 12 wherein said wafer is N-type silicon.

17. A method according to claim 12 wherein said impurity of a second type is aluminum.

18. A method according to claim 12 wherein said step of passivating said groove comprises applying glass.

* * * * *